United States Patent
Davis

(10) Patent No.: US 8,290,737 B2
(45) Date of Patent: Oct. 16, 2012

(54) TESTING OF AN ELECTRONICS MODULE

(75) Inventor: Julian R. Davis, Bristol (GB)

(73) Assignee: Vetco Gray Controls Limited, Bristol (GB)

( * ) Notice: Subject to any disclaimer, the term of this patent is extended or adjusted under 35 U.S.C. 154(b) by 382 days.

(21) Appl. No.: 12/500,976

(22) Filed: Jul. 10, 2009

(65) Prior Publication Data

US 2010/0010759 A1    Jan. 14, 2010

(30) Foreign Application Priority Data

Jul. 11, 2008 (GB) .................................. 0812719.3

(51) Int. Cl.
G01R 31/00 (2006.01)
G06F 11/30 (2006.01)
G21C 17/00 (2006.01)

(52) U.S. Cl. ..... 702/119; 702/58; 702/183; 166/250.01; 166/336

(58) Field of Classification Search .............. 702/58, 702/119, 183; 166/336, 250.01
See application file for complete search history.

(56) References Cited

U.S. PATENT DOCUMENTS

| | | | |
|---|---|---|---|
| 5,337,234 A * | 8/1994 | Anderson et al. | 702/6 |
| 5,737,517 A * | 4/1998 | Kite et al. | 714/38.1 |
| 5,934,371 A * | 8/1999 | Bussear et al. | 166/53 |
| 6,080,203 A | 6/2000 | Njinda et al. | |
| 6,712,138 B2 * | 3/2004 | Mandal | 166/250.01 |
| 7,261,162 B2 * | 8/2007 | Deans et al. | 166/336 |
| 2003/0141055 A1 * | 7/2003 | Paluch et al. | 166/254.2 |
| 2004/0088115 A1 * | 5/2004 | Guggari et al. | 702/13 |
| 2005/0002417 A1 | 1/2005 | Kelly et al. | |
| 2006/0086497 A1 | 4/2006 | Ohmer et al. | |
| 2007/0109537 A1 * | 5/2007 | Vannuffelen et al. | 356/326 |
| 2009/0288836 A1 * | 11/2009 | Goodall et al. | 166/336 |
| 2011/0253377 A1 * | 10/2011 | Barber et al. | 166/336 |

FOREIGN PATENT DOCUMENTS

| | | |
|---|---|---|
| CA | 2 621 403 | 4/2006 |
| GB | 2 383 236 A | 6/2003 |
| GB | 2 396 086 A | 6/2004 |
| GB | 2 423 207 | 8/2006 |
| GB | 2 443 237 A | 4/2008 |
| WO | 2008149235 A2 | 12/2008 |

OTHER PUBLICATIONS

Search Report Under Section 17, Oct. 2, 2008, issued on Application GB0812719.3; UK Intellectual Property Office.

(Continued)

*Primary Examiner* — Hal Wachsman
*Assistant Examiner* — Regis Betsch
(74) *Attorney, Agent, or Firm* — Bracewell & Giuliani LLP

(57) ABSTRACT

A method of testing an electronics module (11) for an underwater well installation, comprises the steps of: providing a test equipment (7) comprising a processor (8) and a Local Area Network (LAN) switch (9), such that the processor (8) may communicate with the switch (9); providing an electronics module (11) comprising a data acquisition means (12) and a second LAN switch (10), such that the data acquisition means (12) may communicate with the second switch (10); passing test data from the processor (8) to the data acquisition means (12) via the first and second LAN switches (9, 10); and monitoring the response of the electronics module (11) in response to the test data.

14 Claims, 1 Drawing Sheet

OTHER PUBLICATIONS

Logan et al., Intelligent Diagnostic Requirements of Future All-Electric Ship Integrated Power System, 2005 IEEE, pp. 151-163, Paper No. PCIC-2005-18.

Zhang et al., Framework of Prognostic and Health Monitoring Technologies of Electronic Products, Dept. of System Engineering of Engineering Technology, Beijing University of Astronautics and Astronautics, Beijing 100083, China, Feb. 26, 2007. (Abstract translation included).

European Search Report, Application No. EP09160211, dated Nov. 17, 2009.

* cited by examiner

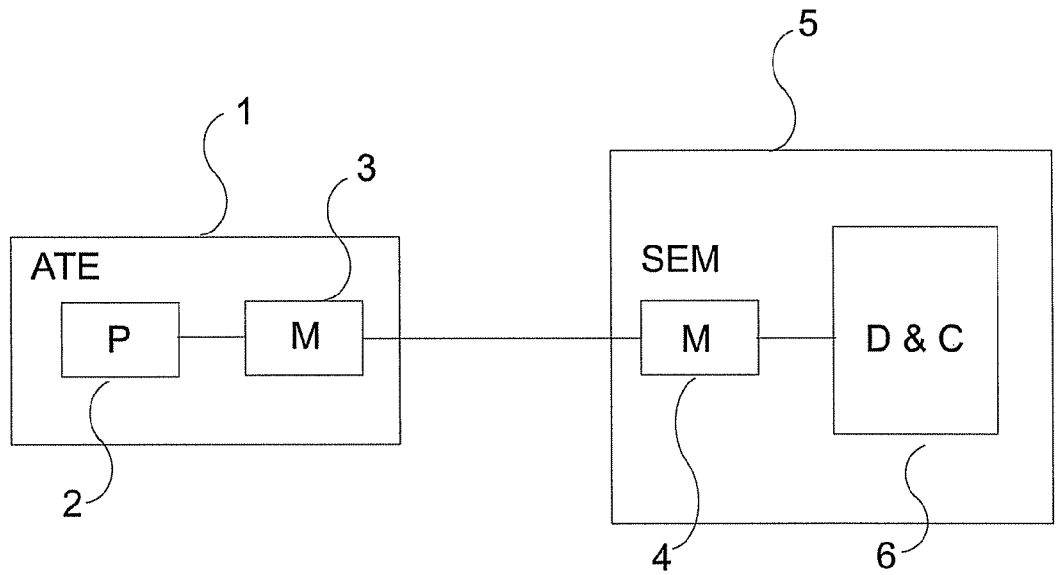
Fig. 1 - Prior art
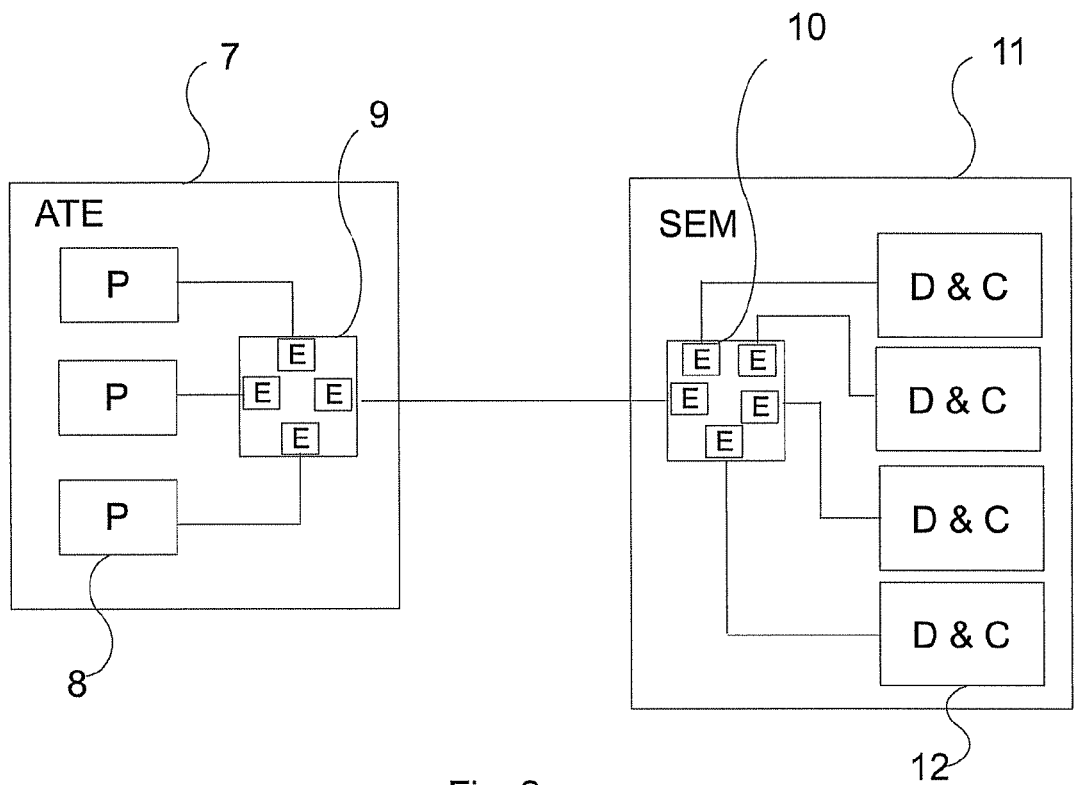
Fig. 2

TESTING OF AN ELECTRONICS MODULE

BACKGROUND OF THE INVENTION

1. Field of the Invention

This invention relates to a method of testing an electronics module for an underwater well installation, for example a so-called Subsea Electronics Module (SEM), testing equipment and a testing system for testing such a module.

2. Description of Related Art

The control of subsea fluid extraction wells is generally managed by a Subsea Electronics Module (SEM), which is typically housed in a Subsea Control Module (SCM), which is in turn mounted on a subsea Xmas tree located on the sea bed, above the fluid extraction well. Existing SEMs contain a number of printed wiring boards which perform dedicated functions, such as the operation of hydraulic Directional Control Valves (DCVs), with communication to and from the SEM via a modem. In existing systems, the testing of the SEM, typically by Automatic Test Equipment (ATE) has had to be effected via the only communication port, i.e. the modem.

FIG. 1 schematically shows such a conventional testing arrangement. An ATE 1 incorporates a processor 2 which generates required test signals. These are fed via a modem 3 to a modem 4 located in a SEM 5. The output of the modem 4 feeds the required test signals to a plurality of Data acquisition and Control (D & C) cards 6, also located in the SEM 5.

Furthermore, testing has to use a production communication protocol, which is sequential and slow. One of the requirements is to perform active testing of the operation of the SEM during vibration tests and, currently, the vibration testing time limit (as to the standards) does not permit thorough testing of all required aspects of the SEM.

SUMMARY OF THE INVENTION

It is an aim of the present invention to overcome these problems and permit stressing of an electronics module by fully exercising it under test control, including during time limited vibration testing, which is far better at revealing faults than the previous relatively slow sequential method.

This aim is achieved by utilizing high speed Local Area Network (LAN) communication, such as Ethernet, between ATE and the module to enable much faster exercising of the latter's electronics. The invention allows much more comprehensive testing of SEMs, prior to subsea installation, at a much lower cost than existing modem linked systems, due to the substantial reduction of testing time. Existing ATE typically employs a single processor to provide the test signals, since the speed of the process is limited by the slow communication to the SEM. However this invention, which makes use of much faster LAN communication makes the employment of multiple processors, working in parallel, an attractive enhancement of the ATE, which can then effect even faster SEM testing.

In accordance with a first aspect of the present invention, there is provided a method of testing an electronics module for an underwater well installation, comprising the steps of: providing a test equipment comprising a processor and a Local Area Network (LAN) switch, such that the processor may communicate with the switch; providing an electronics module comprising a data acquisition means and a second LAN switch, such that the data acquisition means may communicate with the second switch; passing test data from the processor to the data acquisition means via the first and second LAN switches; and monitoring the response of the electronics module in response to the test data.

In accordance with a second aspect of the present invention there is provided testing equipment for testing an electronics module for use at a well installation, comprising: a processor for outputting test data; and a LAN switch, connected such that the processor may communicate with the switch.

In accordance with a third aspect of the present invention, there is provided a testing system for an electronics module for use at a well installation, comprising the test equipment according to the second aspect, and an electronics module comprising a data acquisition means and a second Local Area Network (LAN) switch, such that the data acquisition means may communicate with the second switch.

Other possible features of the invention are set out in the accompanying claims.

BRIEF DESCRIPTION OF THE DRAWINGS

The invention will now be described, by way of example, with reference to the accompanying drawings, in which:—

FIG. 1 schematically shows a conventional arrangement having a modem-linked SEM, connected to an ATE utilizing a single ATE processor; and FIG. 2 schematically shows an arrangement in accordance with the present invention.

DETAILED DESCRIPTION OF THE INVENTION

FIG. 2 shows an arrangement in accordance with the present invention utilizing a multiple processor ATE connected to a modem SEM via a LAN, in this case Ethernet, network.

Automatic Test Equipment 7 incorporates a multiplicity of processors 8 (three being shown in the figure) which operate in parallel, each outputting packages of test signal data to an Ethernet switch 9. A Subsea Electronics Module (SEM) 11 comprises a second Ethernet switch 10. Together, the Ethernet switches 9 and 10 form part of a Local Area Network (LAN) system, such that communication is enabled between the ATE 7 and SEM 11. SEM 11 further includes data acquisition means, such as a plurality of Data acquisition and Control (D&C) electronics cards 12, in FIG. 2 four such cards 12 are shown. These may communicate both externally and internally via the LAN.

In use, test data signals from the processors 8 are sent to the D&C cards 12 via switches 9 and 10 across the LAN. The SEM's response, sent back to the ATE 7 via the LAN, is monitored to evaluate the operation of the SEM. The test may involve vibration testing. Typically, this testing is carried out prior to deployment of the SEM 11. Such testing is generally automatically performed.

Modern well communication systems often employ high speed optical modems and LAN/Ethernet networks, between the well control platform of an installed production well complex and the SEMs. This enables the SEM 11 to be tested during operation, i.e. following deployment at the well installation. In this case, the same LAN as used for the platform-installation communication would also be used for the testing.

In this way, the inventive system enables high speed and comprehensive testing of the SEM, due to the high speed of test data from the parallel-operating processors 8, feeding test data via the relatively high speed LAN.

ADVANTAGES OF THE INVENTION

1) Automatic testing of a SEM is made faster, malting it cost effective to fully test all aspects of the SEM electronics.

Full testing of SEMs was not previously cost effective as the testing time took too long, and during vibration testing was not possible. (It should be noted that vibration testing of a SEM is limited by the testing standards in order to avoid excessive mechanical stressing of the device under test.)

2) Multiple processors in the ATE may be used, operating in parallel to minimize testing time and thus costs.

3) The detailed testing of SEMs during well operation, for example for fault location, is made possible.

The above described embodiments are exemplary only, and various alternatives are possible within the scope of the claims.

For example, the LAN may use a standard other than Ethernet, for example Wi-Fi.

The invention claimed is:

1. A method of testing a subsea electronics module (SEM) for an underwater well installation, comprising the steps of:
   providing test equipment configured for testing an SEM, the test equipment comprising a plurality of processors and a first Local Area Network (LAN) switch, such that the processors may communicate with the first LAN switch;
   providing an SEM for an underwater well installation, the SEM comprising a data acquisition means and a second LAN switch, such that the data acquisition means may communicate with the second switch;
   separately passing packages of test data from each of the processors of the test equipment, in parallel, to the data acquisition means of the SEM undergoing testing via the first and second LAN switches to thereby reduce testing time, performed separately from normal operations of the SEM in the underwater well installation; and
   monitoring for a corresponding response of the SEM in response to the test data passed to the SEM, the monitoring performed by the test equipment to evaluate operation of the SEM.

2. A method according to claim 1, further comprising the step of:
   evaluating operation of the SEM for fault location performed by the test equipment responsive to the response of the SEM in response to the test data passed to the SEM.

3. A method according to claim 1, wherein the SEM response comprises response data sent from the SEM to the test equipment via the second and first LAN switches.

4. A method according to claim 1, wherein the first and second LAN switches comprise Ethernet switches.

5. A method according to claim 1, wherein the data acquisition means of the SEM comprises a plurality of Data Acquisition and Control (D&C) cards, and wherein the step of separately passing packages of test data from each of the processors of the test equipment, in parallel, to the data acquisition means of the SEM undergoing testing, includes:
   each of the, plurality of processors providing the test data in parallel to a separate one of the plurality of D&C cards.

6. A. method according to. claim 1, wherein the test conditions include vibration testing of the SEM.

7. A method according to claim 1, which is performed prior to deployment of the SEM at the well installation.

8. A testing system for a subsea electronics module (SEM) for use at a well installation, comprising:
   test equipment comprising a plurality of processors for outputting test data to an SEM at a well installation and a first Local Area Network (LAN) switch, configured such that each of the plurality of processors communicate with the first LAN switch, the test equipment further configured to separately communicate packages of the test data from each of the plurality of processors, in parallel, to a data acquisition means of the SEM via the first LAN switch of the test equipment and a second LAN switch of the SEM to thereby reduce testing time, and to receive a response to the test data from the SEM to thereby evaluate operation of the SEM; and
   the SEM comprising the data acquisition means and the second LAN switch, the SEM configured such that the data acquisition means communicates with the second LAN switch to provide the test equipment a response to test data in response thereto to so that the test equipment evaluates operation of the SEM.

9. A method according to claim 1, wherein the SEM is an operationally deployed SEM, the method further comprising the step of:
   performing time-limited vibration testing when performing the steps of separately passing packages of test data from each of the processors of the test equipment, in parallel, to the data acquisition means of the SEM undergoing testing and monitoring for a corresponding response of the SEM in response to the test data passed to the SEM.

10. A method according to claim 9, wherein the data acquisition means comprises a plurality of D&C cards, and wherein the step of separately passing packages of test data from each of the processors of the test equipment, in parallel, to the data acquisition means of the SEM undergoing testing, includes:
    each of the plurality of processors providing the test data in parallel to a separate one of the plurality of D&C cards to thereby minimize testing time.

11. A method according to claim 7,
    wherein test conditions include vibration testing of the SEM; and
    wherein the vibration testing is time-limited vibration testing.

12. A testing system as defined in claim 8, wherein the test equipment is further configured to perform the following operations:
    monitoring for a corresponding response of the SEM in response to the test data passed to the SEM; and
    evaluating, operation of the SEM for fault location responsive to the response of the SEM in response to the test data passed to the SEM.

13. A testing system as defined in claim 8, wherein the data acquisition means of the SEM comprises a plurality of Data Acquisition and Control (D&C) cards, and wherein the operation of separately communicating packages of the test data from each of the plurality of processors, in parallel, to the data acquisition means of the SEM undergoing testing, includes:
    each of the plurality of processors providing the test data in parallel to a separate one of the plurality of D&C cards.

14. A method according to claim 1, wherein the data acquisition means of the SEM comprises a plurality of Data Acquisition and Control (D&C) cards.

* * * * *